United States Patent [19]

Sakatsu et al.

[11] Patent Number: 5,616,206
[45] Date of Patent: Apr. 1, 1997

[54] METHOD FOR ARRANGING CONDUCTIVE PARTICLES ON ELECTRODES OF SUBSTRATE

[75] Inventors: Tsutomu Sakatsu, Hadano; Yoshihiro Yoshida, Yokohama, both of Japan

[73] Assignee: Ricoh Company, Ltd., Tokyo, Japan

[21] Appl. No.: 260,844

[22] Filed: Jun. 16, 1994

[30] Foreign Application Priority Data

Jun. 15, 1993 [JP] Japan .................................. 5-143153
Jul. 20, 1993 [JP] Japan .................................. 5-200991

[51] Int. Cl.$^6$ .................................................. B44C 1/165
[52] U.S. Cl. .................. 156/230; 156/272.2; 156/272.4; 156/297; 228/254; 427/272; 427/282
[58] Field of Search ............................. 156/244.22, 241, 156/230, 233, 235, 239, 297, 299, 300, 272.2, 244.17, 273.3, 273.9; 228/254, 56.3, 246; 427/272, 282, 287

[56] References Cited

U.S. PATENT DOCUMENTS

| 3,486,223 | 12/1969 | Butera .................... 228/254 X |
| 3,612,955 | 10/1971 | Butherus ................. 317/101 A |
| 3,658,618 | 4/1972 | Gramann ................ 156/299 X |
| 4,209,552 | 6/1980 | Welch ........................ 427/78 |
| 4,545,610 | 10/1985 | Lakritz et al. ............. 29/578 X |
| 4,737,112 | 4/1988 | Jin ........................... 428/900 X |
| 4,740,259 | 4/1988 | Heinen ................... 156/299 X |
| 4,744,850 | 5/1988 | Imano et al. ............. 156/297 X |
| 5,074,947 | 12/1991 | Estes et al. ............. 156/299 X |
| 5,076,485 | 12/1991 | MacKay ................. 156/297 X |
| 5,118,027 | 6/1992 | Braun et al. ............. 228/245 X |
| 5,170,931 | 12/1992 | Desai et al. ............. 228/180.2 |
| 5,192,835 | 3/1993 | Bull et al. ............... 228/56.3 X |
| 5,197,655 | 3/1993 | Leerssen et al. ........... 228/254 |
| 5,205,896 | 4/1993 | Brown et al. ............. 156/297 |
| 5,217,597 | 6/1993 | Moore et al. ............. 205/123 |
| 5,219,117 | 6/1993 | Lin .......................... 228/253 |
| 5,221,417 | 6/1993 | Basavanhally ........... 156/629 |
| 5,269,453 | 12/1993 | Melton et al. ........... 228/180.2 |
| 5,284,287 | 2/1994 | Wilson et al. ........... 228/254 X |
| 5,323,947 | 6/1994 | Juskey et al. ............ 228/56.3 |
| 5,332,869 | 6/1994 | Hagiwara ................ 174/257 |

FOREIGN PATENT DOCUMENTS

| 00479431 | 2/1988 | Japan . |
| 0289070 | 12/1991 | Japan . |
| 404264179 | 9/1992 | Japan ................... 156/297 |

*Primary Examiner*—David A. Simmons
*Assistant Examiner*—Paul M. Rivard
*Attorney, Agent, or Firm*—Cooper & Dunham LLP

[57] ABSTRACT

A method for arranging conductive particles on electrodes of a substrate, which electrically connect with electrodes of an electric part via the conductive particles. An adhesive layer is formed on the electrodes. Conductive particles are arranged on the adhesive layer in a predetermined pattern. Then, the conductive particles on said electrodes of a substrate are affixed thereon.

13 Claims, 11 Drawing Sheets

METHOD FOR ARRANGING CONDUCTIVE PARTICLES ON ELECTRODES OF SUBSTRATE

BACKGROUND OF THE INVENTION

1. Field of the Invention

The invention relates to forming connections between electronic parts, such as IC chips, etc., and substrates. More particularly, the invention relates to the arrangement of electrically conductive particles on electrodes of a substrate or electrodes of an electronic part to create an electrical contact.

2. Description of Related Art

Wire bonding and wireless bonding techniques are used to mount electronic parts, such as IC-chips, to substrates, such as ceramic substrates.

More recently, bare-chip mounting methods which fix a chip directly to a substrate have become the focus of attention in the technical field of mounting semiconductor chips. In the bare-chip mounting method, conductive particles are arranged on the electrodes of an electronic part or on the electrode pattern formed on the substrate. Electrodes of the electronic part electrically contact the electrodes of the substrate via the conductive particles.

Japanese Laid-Open Patent Publication No.63-47943/1988 describes a method for affixing coated particles to a substrate to form an electrical connection. An adhesive is sprayed onto an electrode pattern area on a substrate. Globular conductive particles, coated with isolating resin, called microcapsules, are put on the substrate. Some of the microcapsules adhere to the electrodes. The extra microcapsule, which have not adhered to the electrodes, are removed. Then, the electronic part is positioned relative to the substrate, and the electronic part and substrate are treated by heat and pressure to form an electrical connection.

This method, however, does not control the number of conductive particles or their arrangement on the electrodes. When the number or arrangement of the conductive particles on the electrode varies, contact resistance may become inconsistent from electrode to electrode.

To reduce inconsistent contact resistance, it is possible to increase the number of conductive particles. However, this tends to increase material costs because extra conductive particles may need to be applied to the surface. Many of these are removed and discarded in the production process, resulting in waste of material.

The paper "Bare-Chip Face-down Bonding Technology Using Conductive Particles and Light-Setting Adhesives" by YAMAMURA, HYBRIDS VOL. NO. 6, pp 3–8(1992), describes a method in which an electrically insulating, light-setting adhesive is sprayed on a substrate (wafer). The electrode pad areas are masked by a photomask, which is transparent in areas that do not correspond to electrode pad areas but is opaque in areas corresponding to electrode pad areas. The light-setting adhesive is cured by irradiating it with ultra-violet light through the transparent parts of the photomask. The cured areas between the electrode pads solidifies and is not sticky while the uncured areas on the electrode pads remain sticky. Electrically conductive particles are then placed on the substrate and selectively adhere to the uncured areas that corresponds to electrode pads. The electrically conductive particles are thus selectively applied only to the electrodes of the substrate.

The methods described above may result in an arrangement of particles as shown in FIG. 13. Electrically conductive particles 52 adhere to the electrode 51 in a configuration where two or more particles 52 are stacked or staggered in the vertical direction. As a result, electrode thickness may not be even. Strict control of the spraying of the adhesive 53 is necessary to reduce or avoid this problem.

FIG. 14 shows electrically conductive particles 63 arranged over a broad surface of an electrode 62 of an electronic part 61. In this arrangement, contact may be lost in the center of the electrode 62 of electronic part 61 and an electrode 66 on substrate 65, because the force supporting the conductive particles 63 between the electrode 62 of the electronic part 61 and the electrode 66 of the substrate 65 depends on forces exerted by the adhesive 64 surrounding the patterned area of the electrode 62. The result may be unstable contact resistance.

Japanese Laid-open Patent Publication No. 3-289070/1991 discusses another connecting method in which an electrode terminal on a first electrical circuit electrically connects with an electrode terminal on a second electric circuit via conductive particles. The electrodes are mutually fixed by adhesive. In that method an adhesive layer is formed on the electrode terminal on the surface of the electrical circuit substrate. The conductive particles adhere to the adhesive layer. Thereafter, the first electrical circuit electrically connects with the electrode terminal on the second electric circuit via the conducting particles. However, when the conductive particles are put onto the insulating adhesive to connect an electronic part having a fine-pitched arrangement of electrodes, the high density of conductive particles required to make adequate contact sometimes results in short circuits between adjacent electrodes because some conductive particles may adhere to areas between the adjacent electrodes.

SUMMARY OF THE INVENTION

An object of the invention to provide an improved method for arranging electrically conductive particles on electrodes for making electrical connections in a way that reduces or eliminates shortcomings of the known techniques. More specifically, an object of the invention is to provide an improved method for arranging electrically conductive particles on electrodes in which the conductive particles can be arranged at a fine pitch without causing short circuits between adjacent electrodes.

The arrangement of conductive particles is kept uniform to provide consistent contact resistance between electrodes. In addition, this method reduces costs because it does not involve the discarding of unused particles.

Other objects, advantages and novel features of the invention will become apparent from the following detailed description of the invention when considered in conjunction with the accompanying drawings.

DETAILED DESCRIPTION OF PREFERRED EMBODIMENTS

Preferred embodiments of the present invention will be described hereinafter, with reference to the drawings.

EMBODIMENT 1

Figure 1A:
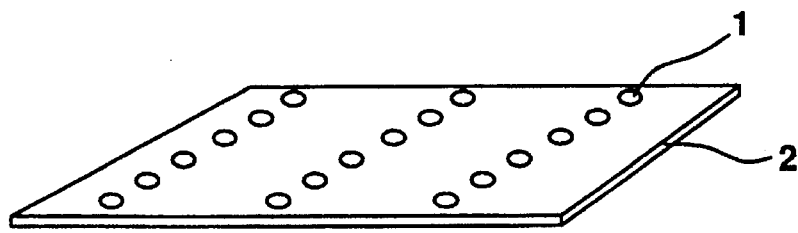
FIG. 1(a) is a perspective view of a mask according to the present invention.

FIG. 1(a) is a perspective view of a mask according to the invention. FIG. 1 (b) is a sectional view for explaining a method for arranging conductive particles on a transcription board according to the invention. FIG. 1(c) is a perspective view of a transcription board according to the invention.

A method for transferring conductive particles to a transcription substrate will be explained first.

As illustrated in the FIG. 1(a), 50 μm diameter openings 1 are formed in a mask 2 made by nickel electroforming. There are 2490 such openings in this example. The thickness of the mask 2 is 40 μm. The openings 1 are formed in a predetermined pattern at a pitch of 100×200 μm.

Figure 1B:
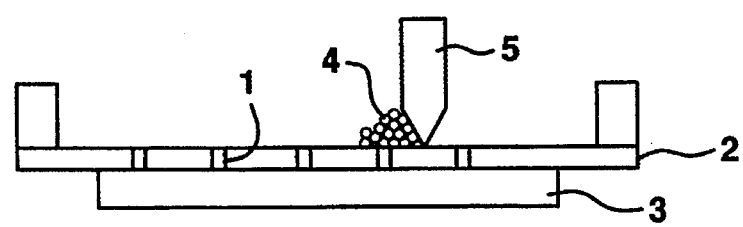
FIG. 1(b) is a sectional view useful in explaining a method for arranging conductive particles on a transcription board according to the invention.
Figure 1C:
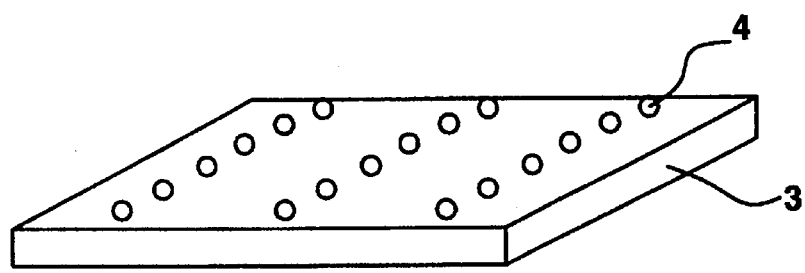
FIG. 1(c) is a perspective view of a transcription board according to the invention.

As seen in FIG. 1(b), the mask 2 is placed on a transcription board 3. A silicone rubber layer (not shown) is formed on the surface of transcription board 3 facing mask 2, and the conductive particles are placed on the mask 2.

The electrically conductive particles 4 are about 40 μm in diameter. These conductive particles are either particles of conductive material, such as metallic particles, or metal particles covered with a thermoplastic resin, or are particles covered with a metal plating.

The conductive particles 4 are moved by a squeegee 5 and individual conductive particles 4 fall onto the transcription board 3 through the openings 1 of the mask 2. A respective conductive particle 4 falls into each of the openings 1 of the mask 2.

In this embodiment, the size (diameter) of each opening 1 of the mask 2 is less than twice the size (diameter) of a conductive particle 4. Therefore, only one particle will fit into each opening 1.

As shown in the FIG. 1(c), after the mask 2 is separated from the transcription board 3, the conductive particles 4 remain on the transcription board 3 in a predetermined pattern. As mentioned above, the mask 2 controls the number and position of the conductive particles that remain in the transcription board 3. As a result, the arrangement of the conductive particles can be selected to use the process in a wide variety of applications, such as in printed circuit substrates or in LSI by changing of the design of the mask 2.

A method for forming an adhesive layer on electrodes of a circuit board is described hereinafter with reference to the FIGS. 2(a) through 2(e).

Figure 2A:
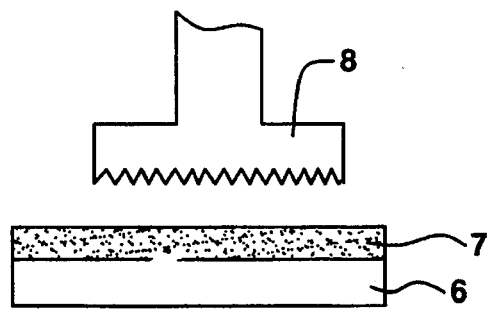
FIGS. 2(a) through 2(e) are sectional views useful in explaining the flow of a process for forming an adhesive layer on electrodes of a circuit board according to the invention.
Figure 2B:
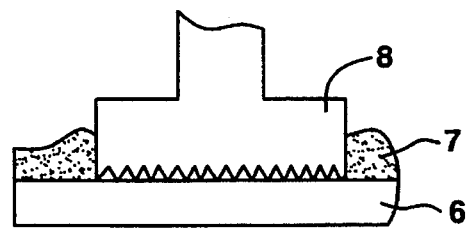

As shown in the FIGS. 2(a) and 2(b), adhesive is applied on a flat board 6 in a layer 7 at a thickness of from 10 μm to 200 μm.

A transfer board 8 having a rough surface, is pressed onto the surface of the adhesive layer 7 on the flat board 6. The rough surface may be formed, for example, by affixing sand paper coated with #600 to 1200 abrasive (JIS, R-6001) to the surface of the transfer board 8.

Figure 2C:
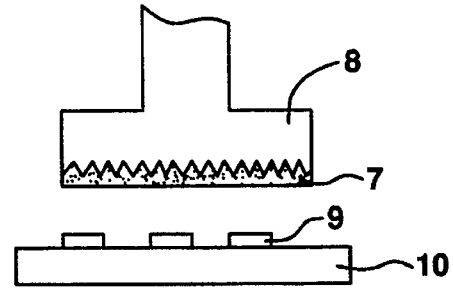
Figure 2D:
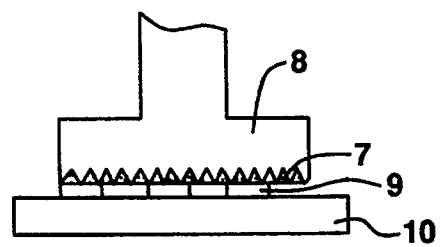

As shown in FIGS. 2(c) and 2(d), the transfer board 8 is separated from the flat board 6 with an adhesive layer 7 remaining on the rough surface of the transfer board 8. The adhesive layer 7 on the rough surface of the transfer board 8 is pressed against the electrodes 9 on a circuit substrate 10. The adhesive layer 7 is thus transferred from the transfer board 8 onto the electrodes 9 on the circuit substrate 10.

Figure 2E:
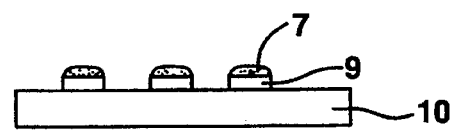

As shown in the FIG. 2(e), after the transfer board 8 is separated from the circuit substrate 10, an adhesive layer 7 remains on the electrodes 9 on the circuit substrate 10.

A method for transferring the conductive particles 4 to the transcription board 3 and affixing the adhesive layer 7 onto the electrodes 9 of the circuit substrate 10 is described hereinafter.

Figure 3A:
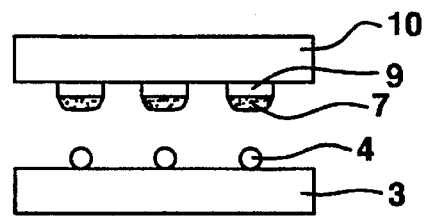
FIGS. 3(a) through 3(d) are sectional views useful in explaining a process for affixing conductive particles to electrodes according to the invention.
Figure 3B:
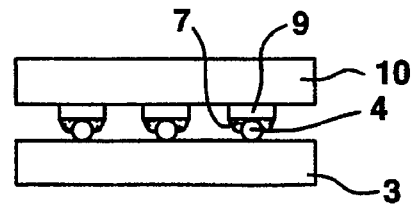
Figure 3C:
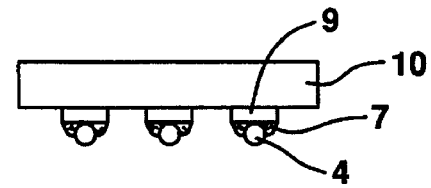
Figure 3D:
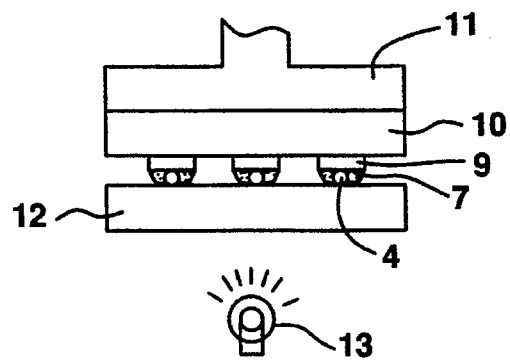

As illustrated in FIGS. 3(a) and 3(b), the circuit substrate 10 and the transcription board 3 with particles 4 thereon, are registered relative to each other such that the conductive particles 4 on the transcription board 3 are aligned with the electrodes 9. The circuit substrate 10 is then pressed onto the transcription board 3, As illustrated in FIG. 3(c), after the circuit substrate 10 is separated from the transcription board 3, the conductive particles 4 that were on the transcription board 3 remain on the electrodes 9 of the circuit substrate 10. As illustrated in FIG. 3(d), the conductive particles 4 on the circuit substrate 10 are pressed by a pressing head 11 from the reverse side of the circuit substrate 10 against a quartz glass plate 12. The adhesive layer 7 is exposed to ultraviolet light from a source 13 through the quartz glass plate to cure the layer 7. As a result, the conductive particles 4 are affixed to the electrodes 9 of the circuit substrate 10 and are in electrical contact with the electrodes 9.

A wiring structure is completed when the electrodes 9 on the circuit substrate 10 make electrical connections with electrodes of a second electronic part via the conductive particles 4.

In this embodiment, as mentioned above, the conductive particles 4 are arranged on the transcription board 3 in a predetermined pattern. The conductive particles 4 on the transcription board 3 are transferred onto the electrodes 9 of the circuit 10, which is covered by the adhesive layer 7. The particles are pressed into the adhesive layer 7 by the pressing head 11 and the quartz glass window 12 and hardened by ultraviolet radiation from source 13, thus affixing the conductive particles 4 to the electrodes 9 of the circuit substrate 10.

Figure 4:
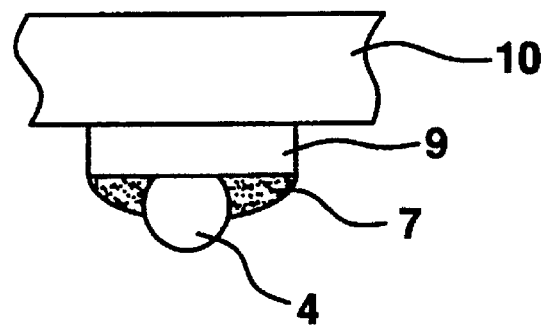
FIG. 4 is a sectional view illustrating a conductive particle secured to an electrode according to the invention.

Furthermore, in this embodiment, the adhesive layer 7 on the electrode 9 can be made thick because it is transferred from the rough surface of transfer board 8. This thick adhesive layer 7 has adequate strength to affix the conductive particles 4 onto the electrical contacts 9 of the substrate 10. As seen in FIG. 4, the transfer of the conductive particles is well controlled and variations in contact resistance can be avoided or at least reduced.

Figure 5:
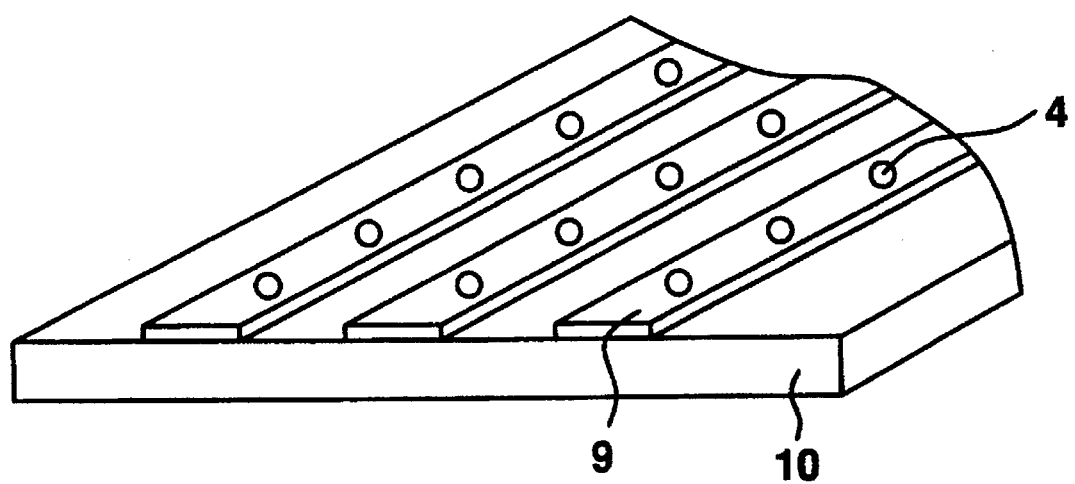
FIG. 5 is a perspective view of a circuit board according to the invention.

As illustrated in FIG. 5, the conductive particles 4 are affixed on the electrodes 9 of the circuit substrate 10 in predetermined numbers and positions by hardening the adhesive layer 7. There are no conductive particles between adjacent electrodes when the circuit substrate 10 is affixed to a second electronic substrate. Therefore, it is possible to place contact electrodes at a finer pitch and still avoid short circuits or open connections.

Further, because the number of conductive particles and their arrangement on the electrodes are constant and uniform from electrode to electrode, variations in contact resistance among the electrodes can be reduced.

Still further, because excess conductive particles do not have to be applied to the surface, there is less waste. Only the required number of conductive particles necessary to create electrical contacts need be applied to the substrate. As a result, conductive particle use is efficient and material costs are lowered.

EMBODIMENT 2

A second embodiment of the invention will be described hereinafter. The elements which are the same as or similar to those of the previous embodiment are designated by the same reference numerals.

In this embodiment, the width of the openings 1 in the mask 2 is less than twice the diameter of the conductive particles 4. The thickness of 2 the mask is also less than twice the diameter of the conductive particles 4. The length of the openings 1, however, is greater than twice the diameter of the conductive particles 4. Therefore, two or more conductive particles 4 will fit into each of the openings 1 of mask 2 at the same time.

Figure 6A:
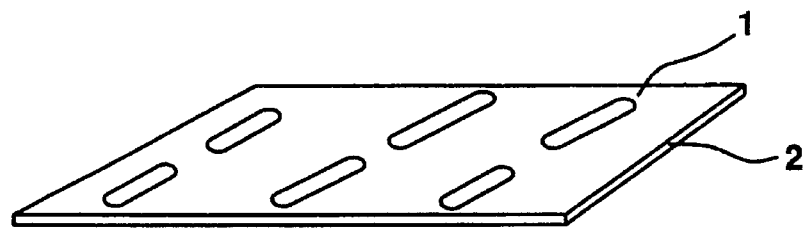
FIG. 6(a) is a perspective view of an alternative embodiment of a mask according to the invention.
Figure 6B:
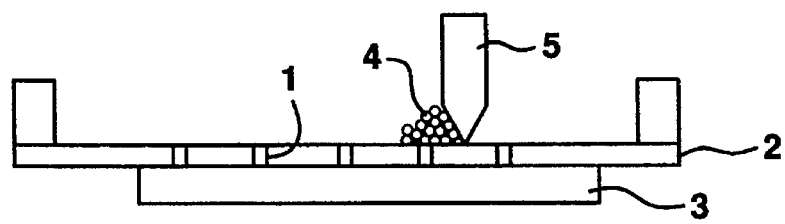
FIG. 6(b) is a sectional view useful in explaining an alternative embodiment of a method for arranging conductive particles on a transcription board according to the invention.

As seen in FIG. 6(a), the openings 1 are elongated and have rounded ends. In this example they are 60 μm×170 μm, and are formed on the mask 2 in a predetermined rectangular pattern of 5×110. The mask 2 is made by nickel electroforming and has a thickness of 50 μm. As seen in FIG. 6(b), the mask 2 is set against the transcription board 3. A silicone rubber layer is formed on the surface of the transcription board 3 facing the transcription board 3. The conductive particles 4, which are about 40 μm in diameter each, are deposited on the mask 2. The conductive particles 4 are moved by a squeegee 5 and the conductive particles 4 fall onto the transcription board 3 through the openings 1 of the mask 2. The openings 1 of the mask 2 are each filled with a plurality of conductive particles 4 (three or four particles per opening in this example).

Figure 6C:
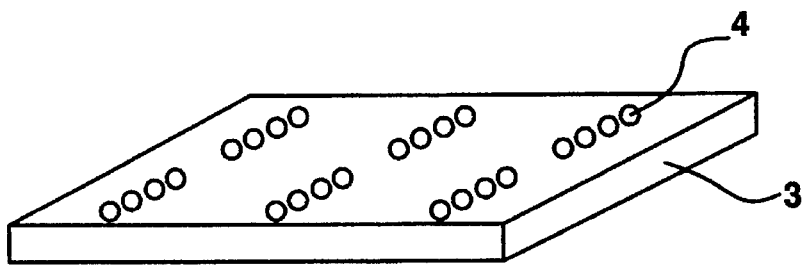
FIG. 6(c) is a perspective view of an alternative embodiment of a transcription board according to the invention.

As seen in FIG. 6(c), the conductive particles 4 remain arranged on the transcription board 3 in a predetermined pattern after the mask 2 is separated from the transcription board 3. In this embodiment, the pattern of the conductive particles 4, in which three or four conductive particles are arranged in one line, is formed on the transcription board 3 in the predetermined rectangular pattern.

The processes which follow are the same as discussed in connection with FIGS. 3(a) through 3(d) in the first embodiment, and so will not be explained again here to avoid redundancy.

EMBODIMENT 3

A third embodiment of the invention will be described hereinafter. The elements that are the same as or similar to those of the previous embodiments are designated by the same reference numerals.

Here, the conductive particles 4 are caused to enter the openings 1 of mask 2 from the side of the mask 2 which faces away from the transcription board 3.

Figure 7A:
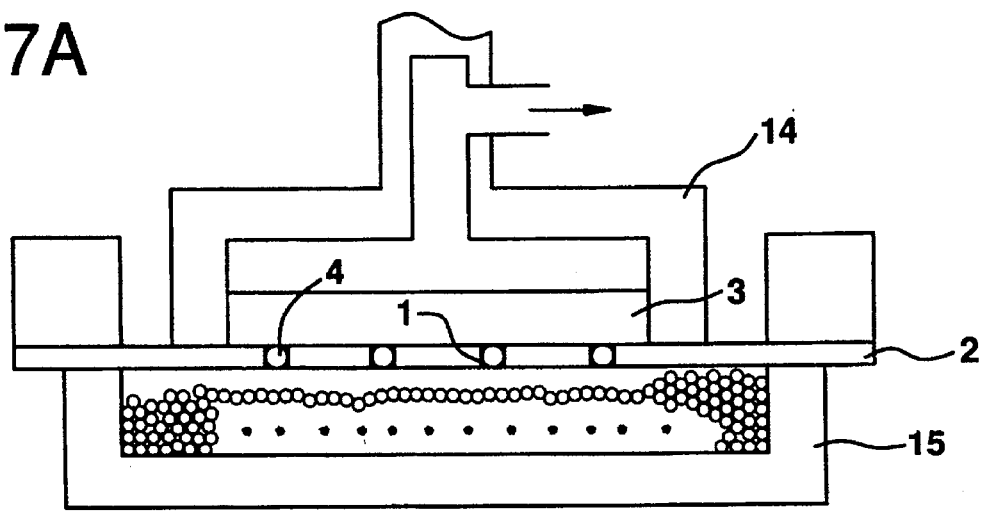
FIGS. 7(a) and 7(b) are sectional views useful in explaining an alternative embodiment of a process for transferring conductive particles to a transcription board according to the invention.

The mechanism for this embodiment is shown in FIG. 7(a). Here, the transcription board 3 is made of a porous and permeable material (e.g., sintered stainless steel). A negative pressure is applied from the chamber 14. The transcription board is lowered to contact the mask 2. A plurality of conductive particles are held in a case 15 beneath mask 2. Next, air is evacuated from the chamber 14 by a vacuum pump (not shown). The negative pressure on the reverse side of the transcription board draws the conductive particles from the case 15 to the mask 2. The conductive particles 4 are caused to enter the openings 1 of mask 2 by the negative pressure in the chamber 14. The conductive particles in the case 15 are stirred by using air or some other method to allow them to fill all the openings 1 in mask 2.

Figure 7B:
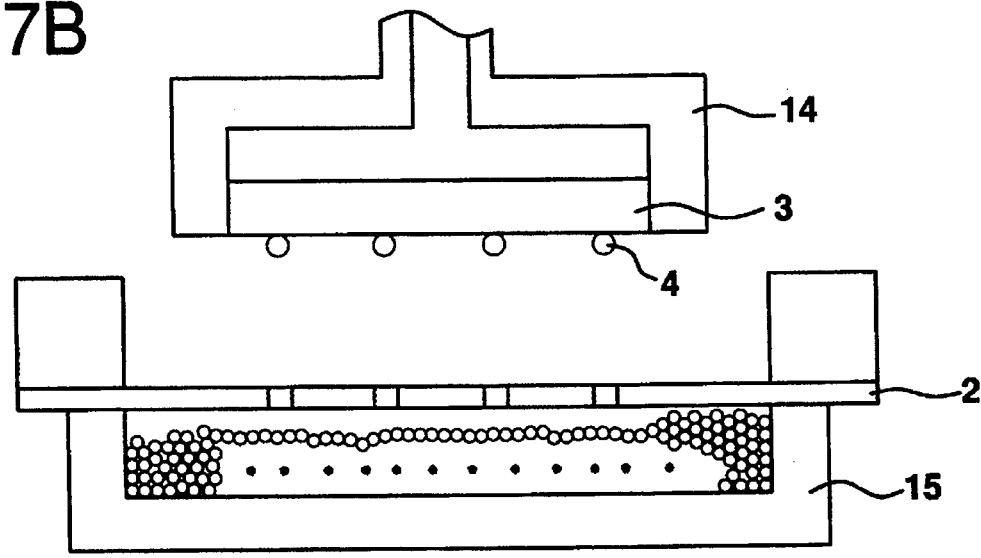

As seen in FIG. 7(b), the chamber 14 and transcription board 3, are separated from the mask 2. Conductive particles 4 remain on the transcription board 3 in the pattern defined by the openings 1 of the mask 2.

Again, the processes which follow are the same as for FIGS. 3(a) through 3(d) the first embodiment, and so will not be explained again here to avoid redundancy.

EMBODIMENT 4

A fourth embodiment of the invention will be described hereinafter. The elements which are the same as or similar to those of the previous embodiment are designated by the same reference numerals.

In this embodiment, a magnetic force generated by an electromagnet 3b is used to draw the conductive particles 4 into the openings 1 of the mask 2. Using magnetic force to move the particles 4 into the openings 1 of mask 2 can be more effective than simply allowing them to fall in.

Figure 8A:
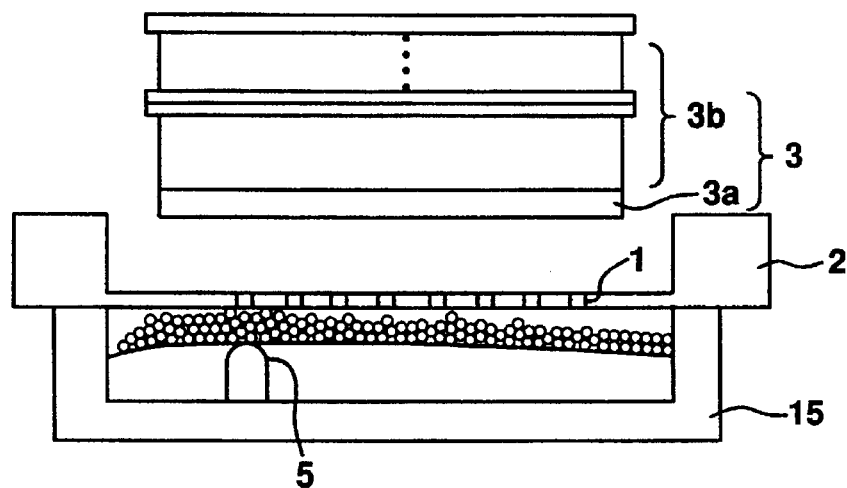
FIGS. 8(a) through 8(c) are sectional views useful in explaining an alternative embodiment of a process for transferring conductive particles to a transcription board according to the invention.
Figure 8B:
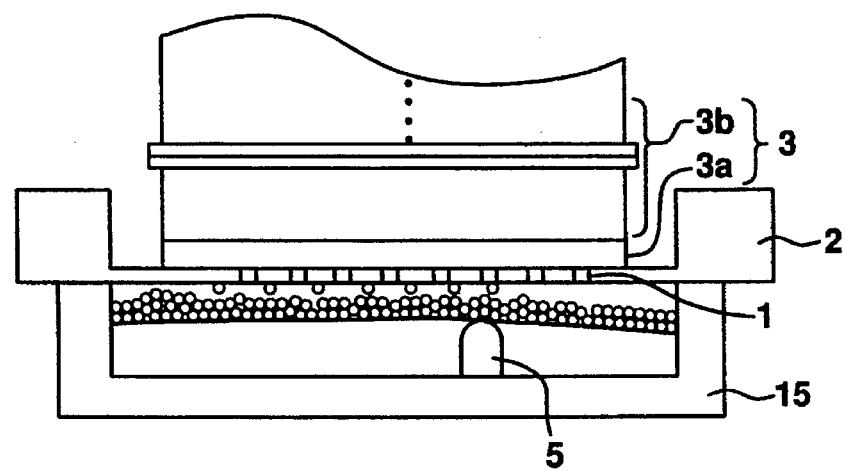

As seen in FIGS. 8(a) and 8(b), the transcription board 3 comprises an electromagnet 3b and a silicon rubber layer 3a. The transcription board 3 is lowered and pressed against one surface of the mask 2. Next, the electromagnet 3b is switched on and a squeegee 5 on the bottom of the case 15 is moved and presses the conductive particles 4 against the other side of the mask 2. The conductive particles are drawn into the openings 1 of the mask 2 by the magnetic force generated by the electromagnet 3b.

The conductive particles 4 which are drawn into the openings 1 of the mask 2 stick to the silicon rubber layer 3a of the transcription board 3.

Figure 8C:
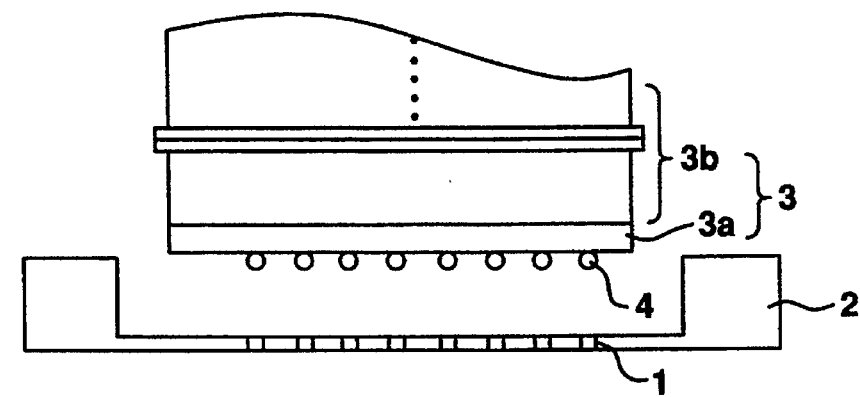

As shown in FIG. 8(c), the transcription board 3 is lifted up and the electromagnet 3b is switched off.

The conductive particles 4 are arranged on the silicon rubber layer 3a of the transcription board 3 in the pattern determined by the mask 2.

The processes that follow are the same as for FIGS. 3(a) through 3(d) in the first embodiment, and so will not be explained here to avoid redundancy.

EMBODIMENT 5

Figure 9:
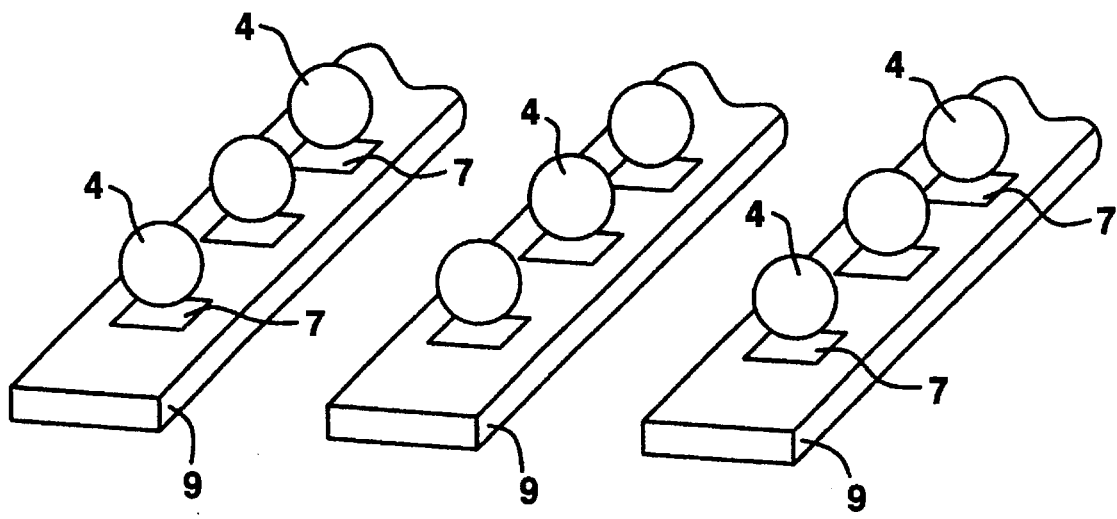
FIG. 9 is a perspective view of an arrangement of conductive particles on an electrodes according to the invention.

In a fifth embodiment, conductive particles 4 which are arranged on the electrodes 9 of the substrate 10, electrically connect electrode 9 to a second electronic part. FIG. 9 shows an arrangement structure of conductive particles.

Adhesive is sprayed onto areas of the electrodes 9 on the substrate 10 in a predetermined pattern of patches of adhesive. The conductive particles 4 are arranged on the adhesive layer 7 in a monolayer (i.e. a layer that is only one particle diameter thick) and at predetermined intervals.

Figure 10:
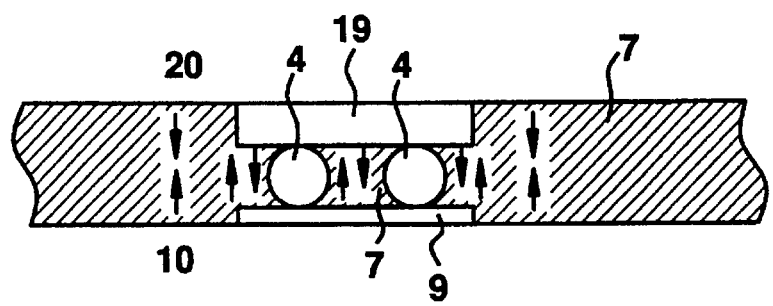
FIG. 10 is a sectional view of a contact region between an electrode of a substrate and an electrode of an electronic part according to the invention.

Conductive particles 4 are also arranged on the electrodes 19 of the second electronic part 20 as seen in FIG. 10. The electrodes 19 of the second electronic part 20 and the electrodes 9 of the substrate 10 of the first electronic part are thus electrically connected via the conductive particles 4.

In this arrangement, an adhesive layer 7 fills the region between adjacent conductive particles 4, and between the substrate of the first part 10 and the second part 20. The adhesive force exerted between the electrodes 19 of the electric part 20 and the electrode 9 of the substrate 10 pulls the parts 10 and 20 together. The compressive force on the conductive particles 4 keeps them in contact with the electrodes and prevents or at least reduces variation in contact resistance.

Because the conductive particles 4 are arranged in a monolayer and are placed at regular intervals, the contact thickness is uniform over each electrode. Further, the contact thickness remains consistent from electrode to electrode.

Figure 11A:
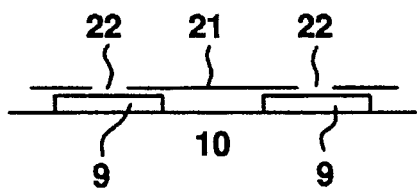
FIGS. 11(a) through 11(g) are sectional views useful in explaining an alternative process for forming a structure according to the invention.

A method for arranging the conductive particles will be described in connection with FIGS. 11(a) through 11(g). A mask 21, in which small openings 22 are formed by a laser beam in predetermined positions, is adjusted such that the openings therein are aligned with the electrodes 9 of the substrate 10, as seen in FIG. 11(a).

Figure 11B:
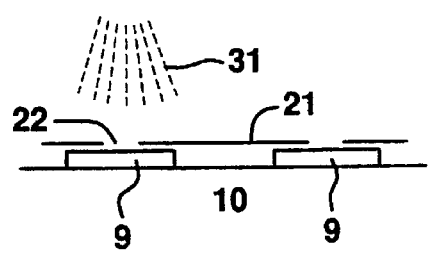
Figure 11C:
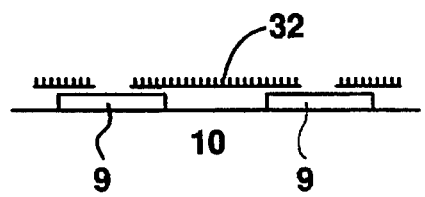
Figure 11D:
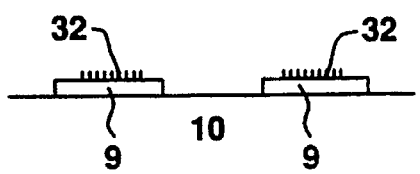
Figure 11E:
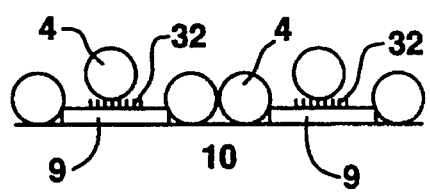
Figure 11F:
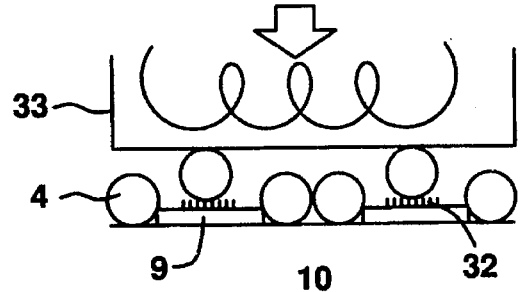
Figure 11G:
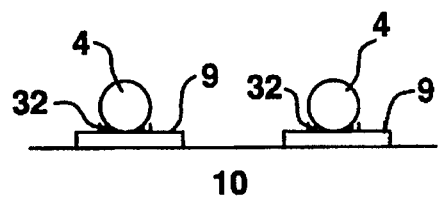

A thermoplastic adhesive resin 31 is sprayed onto the mask 21 or is applied by vapor deposition. The mask 21 is separated from the electrodes 9 of the substrate 10 and an adhesive layer 32 remains on the unmasked areas of the electrodes 9, as seen in FIGS. 11(b) through 11(d). The conductive particles 4 are scattered onto the electrodes 9. The substrate 10 is heated and some of the conductive particles 4 are trapped on the adhesive layer 32, as seen in FIGS. 11(e) through 11(f). The conductive particles 4 on the adhesive layer 32 are pressed by a pressing member 33 and the conductive particles 4 thereby make electrical contact with the surface of the electrodes 9, as seen in FIG. 11(g).

After cooling the substrate 10, the conductive particles 4 which have not adhered to the layer 32 are removed by an air stream or some other method. The conductive particles 4 which were trapped by the adhesive layer 32 remain and are arranged in positions determined by the mask 21.

Another process for forming the conductive particle structure is shown in FIGS. 12(a) through 12(g). A screen printing method may be used to pattern the adhesive layer 32. Photographic techniques may be used to form the screen printing mask 41.

Figure 12A:
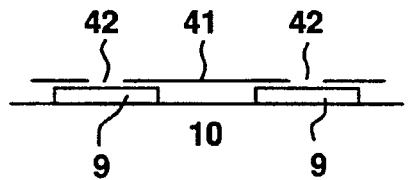
FIGS. 12(a) through 12(g) are sectional views useful in explaining an alternative process for forming a structure according to the invention.
Figure 12B:
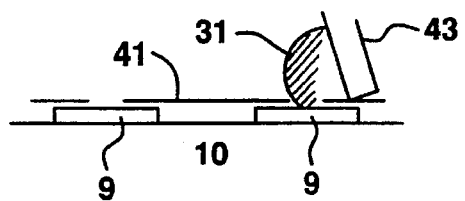
Figure 12C:
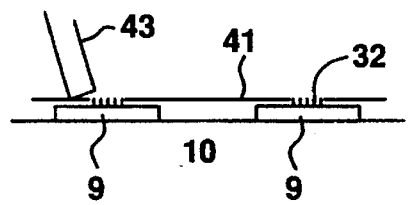
Figure 12D:
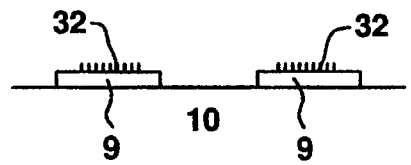
Figure 12E:
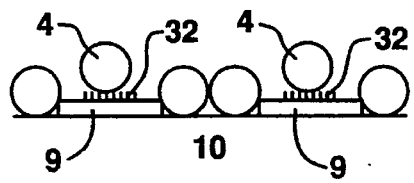
Figure 12F:
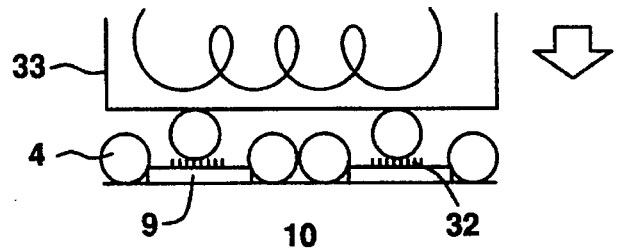
Figure 12G:
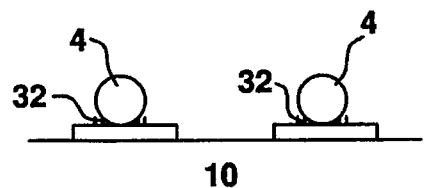
Figure 13:
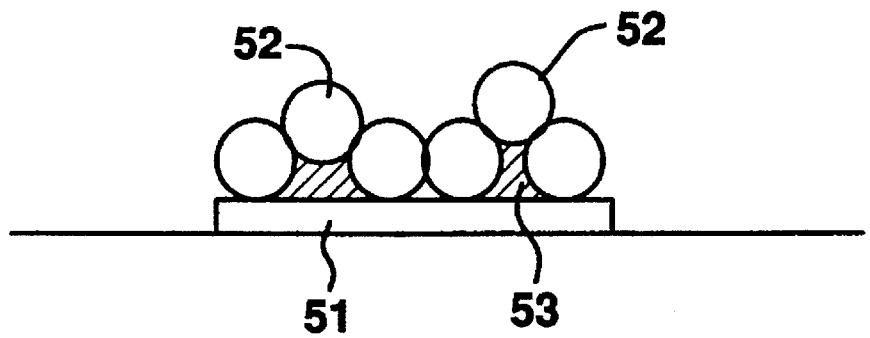
FIG. 13 is a sectional view of an arrangement of conductive particles according to a known technique.
Figure 14:
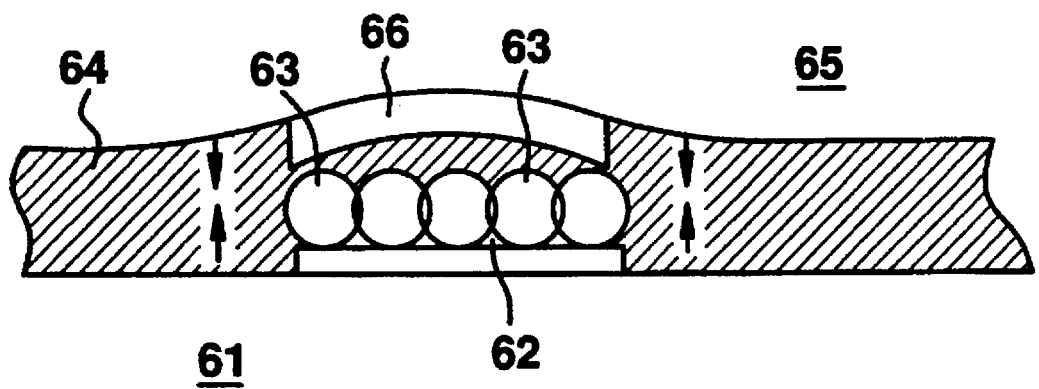
FIG. 14 is a schematic section view of an arrangement of conductive particles according to another known technique.

In FIG. 12(a), a screen 41, with small openings 42, is adjusted such that its openings match the electrodes 9 of the substrate 10, as seen in FIG. 12(a). A thermoplastic adhesive resin 31 is applied to the mask 41 with a squeegee 43.

The screen 41 is removed and the adhesive layer 32 remains on electrodes 9 in positions determined by the mask 41.

The processes which follow are the same as for FIGS. 3(a) through 3(d) in the first embodiment, and so will not be explained here to avoid redundancy.

In summary, it will be seen that the invention provides methods for arranging conductive particles on electrodes which have various advantages over previous methods as enumerated below.

(1) An advantage of the above mentioned embodiments is that each of the methods in accordance with the invention controls the number and arrangement of the conductive particles on the contact electrodes such that the electrodes can be positioned very close to one another without causing short circuits.

(2) Another advantage of the methods in accordance with the invention is that the number and arrangement of the conductive particles is uniform and will result in consistent contact resistance among all electrodes on a substrate.

(3) A further advantage of the methods in accordance with the invention is that material cost for the conductive particles is reduced because excess particles, which would otherwise be discarded, are not applied to the substrate.

Various modifications will become apparent to those skilled in the art after receiving the teachings of the present disclosure without departing from the scope thereof.

What is claimed is:

1. A method for arranging conductive particles on electrodes of a substrate, which electrically connect with electrodes of an electrical part via said conductive particles, comprising the steps of:

disposing a mask having openings formed in a predetermined pattern onto a transcription board;

filling said openings of said mask with conductive particles;

separating said mask from said transcription board;

transferring said conductive particles from said transcription board to electrodes of a substrate, said electrodes having an adhesive formed thereon; and fixing said conductive particles on said electrodes of a substrate by said adhesive layer.

2. The method of claim 1, wherein said adhesive layer formed on said electrodes is formed by the steps including:

forming said adhesive layer on a rough surface of a transfer board;

pressing said adhesive layer formed on said transfer board onto electrodes of said electrical part; and separating said transfer board from said electrical part.

3. The method of claim 1, wherein the size of said openings of said mask is less than twice the size of said conductive particles.

4. The method of claim 1, wherein said conductive particles are caused to enter said openings of said mask from a side of said mask facing away from said transcription board.

5. The method of claim 1, wherein said conductive particles are caused to enter said openings of said mask by magnetic force from a magnet located on a side of said mask facing away from said transcription board.

6. The method of claim 1, wherein said conductive particles are caused to enter said openings of said mask from a side of said mask opposite from said transcription board.

7. A method for arranging electric conductive particles on electrodes of a first electronic part, which electrically connect with electrodes of a second part via the conductive particles, comprising the steps of:

disposing a mask having openings formed in a predetermined pattern onto a transcription board;

filling said openings of said mask with conductive particles;

separating said mask from said transcription board;

transforming conductive particles from said transcription board to electrodes of said first electronic part on which an adhesive layer has been formed; and fixing said conductive particles on said electrodes of said first electronic part by pressing said conductive particles against said electrodes and hardening said adhesive layer.

8. The method of claim 7, wherein said adhesive layer formed on said electrodes is formed by the steps including:

forming said adhesive layer on a rough surface of a transfer board;

pressing said adhesive layer formed on said transfer board onto electrodes of said electronic part; and separating said transfer board from said electronic part.

9. The method of claim 7, wherein the size of said openings of said mask is less than twice the size of said conductive particles.

10. The method of claim 7, wherein said conductive particles are caused to enter said openings of said mask from a side of said mask opposite from said transcription board.

11. The method of claim 7, wherein said conductive particles are caused to enter said openings of said mask by a magnetic force generated by a magnet located on a side of said mask facing away from said transcription board.

12. The method of claim 7, wherein said conductive particles are caused to enter said openings of said mask from a side opposite the contact surface between said mask and said transcription board.

13. A method for arranging conductive particles on electrodes of a substrate, which electrically connect with electrodes of an electrical part via said conductive particles, comprising the steps of:

arranging conductive particles on a transcription board in a predetermined pattern, said predetermined pattern being defined by a mask having openings formed thereon;

transferring said conductive particles from said transcription board to electrodes of a substrate, said electrodes having an adhesive layer formed thereon; and fixing said conductive particles on said electrodes by said adhesive layer.

* * * * *